US011393549B2

(12) United States Patent
Lee (10) Patent No.: US 11,393,549 B2
(45) Date of Patent: Jul. 19, 2022

(54) MEMORY DEVICE AND MEMORY SYSTEM INCLUDING TEST CONTROL SIGNAL GENERATING CIRCUIT (71) Applicant: SK hynix Inc., Gyeonggi-do (KR)

(72) Inventor: Dong Uk Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 86 days.

(21) Appl. No.: 17/076,418

(22) Filed: Oct. 21, 2020

(65) Prior Publication Data
US 2021/0295940 A1 Sep. 23, 2021

(30) Foreign Application Priority Data

Mar. 20, 2020 (KR) .................. 10-2020-0034301

(51) Int. Cl.
*G11C 29/38* (2006.01)
*H01L 25/065* (2006.01)
*G11C 29/12* (2006.01)
*G11C 29/14* (2006.01)

(52) U.S. Cl.
CPC ........ *G11C 29/38* (2013.01); *G11C 29/12015* (2013.01); *G11C 29/14* (2013.01); *H01L 25/0652* (2013.01); *H01L 2225/06513* (2013.01); *H01L 2225/06541* (2013.01); *H01L 2225/06596* (2013.01)

(58) Field of Classification Search
CPC ... G11C 29/38; G11C 29/12015; G11C 29/14; H01L 25/0652; H01L 2225/06513; H01L 2225/06541; H01L 2225/06596
See application file for complete search history.

(56) References Cited

U.S. PATENT DOCUMENTS

| 6,066,988 A * | 5/2000 | Igura ................. H03L 7/083 331/25 |
| 2014/0118038 A1* | 5/2014 | Lin ................. H03L 7/0814 327/149 |
| 2020/0227130 A1* | 7/2020 | Kim ................. G11C 7/222 |

FOREIGN PATENT DOCUMENTS

| KR | 10-2007-0103840 | 10/2007 |
| KR | 10-2013-0072854 | 7/2013 |

* cited by examiner

Primary Examiner — Kyle Vallecillo
(74) Attorney, Agent, or Firm — IP & T Group LLP (57) ABSTRACT A memory system includes a plurality of memory devices coupled to each other through a channel and each including a test clock input pad suitable for receiving an external test clock, a clock generation circuit suitable for generating an input clock and an output clock based on a reference clock and the external test clock in response to a reset signal, a test data processing circuit suitable for parallelizing test data so as to produce parallelized test data and transfer the parallelized test data to a memory area in response to the input clock and the output clock, and a test control signal generation circuit suitable for generating internal test data by serializing the parallelized test data and transferring the internal test data to the channel in response to the input clock and the output clock.

21 Claims, 7 Drawing Sheets

MEMORY DEVICE AND MEMORY SYSTEM INCLUDING TEST CONTROL SIGNAL GENERATING CIRCUIT

CROSS-REFERENCE TO RELATED APPLICATION

The present application claims priority of Korean Patent Application No. 10-2020-0034301, filed on Mar. 20, 2020, which is incorporated herein by reference in its entirety.

BACKGROUND

1. Field

Various embodiments of the present invention relate to a memory device and a memory system, and more particularly, to a plurality of memory devices that generate test control signals and transfer the test control signals to each other through channels, and a memory system including the memory devices.

2. Description of the Related Art

With the rapid development of semiconductor memory technology, a high level of integration and performance is demanded in packaging semiconductor memory devices. To cope with this demand, researchers and the industry are developing diverse technologies related to a three-dimensional structure in which a plurality of semiconductor memory chips are vertically stacked to supplant the two-dimensional structure in which semiconductor memory chips are planarly disposed on a printed circuit board (PCB) using wires or bumps.

Also, as the operation rates of semiconductor memory devices increase, a semiconductor memory system of a System-In-Package (SIP) form in which a memory controller, such as a Central Processing Unit (CPU) or a Graphic Processing Unit (GPU), and a semiconductor memory device are integrated into one package is widely used. Since the pads of a semiconductor memory device of the stacked structure or the SIP structure are not externally exposed, it is difficult to perform a direct test by using a pin of test equipment.

Therefore, the semiconductor memory device may be provided with an additional pad for testing. Inevitably, the number of test pads an integrated and miniaturized semiconductor memory device can accommodate is limited. Accordingly, a technology capable of testing a semiconductor memory device with a limited number of test pads is needed.

SUMMARY

Embodiments of the present invention are directed to a memory system that includes a plurality of memory devices transferring test control signals through channels therebetween to reduce the number of pads for testing.

In accordance with an embodiment of the present invention, a memory system includes: a plurality of memory devices coupled to each other through a channel; wherein each of the memory devices includes: a test clock input pad suitable for receiving an external test clock; a clock generation circuit suitable for generating an input clock and an output clock based on a reference clock and the external test clock in response to a reset signal; a test data processing circuit suitable for parallelizing test data so as to produce parallelized test data and transfer the parallelized test data to a memory area in response to the input clock and the output clock; and a test control signal generation circuit suitable for generating internal test data by serializing the parallelized test data and transferring the internal test data to the channel in response to the input clock and the output clock.

In accordance with another embodiment of the present invention, a memory system includes: a first memory device and a second memory device suitable for transferring and receiving test control signals to and from each other through a channel, and suitable for receiving respective external test clocks through respective test clock input pads, wherein the first memory device includes: a test data input pad suitable for receiving external test data; a first test data processing circuit suitable for parallelizing the external test data so as to produce parallelized external test data and transferring the parallelized external test data to a memory area in response to the corresponding external test clock; and a first test control signal generation circuit suitable for serializing the parallelized external test data so as to produce serialized data and transferring the serialized data and a delayed clock of the corresponding external test clock to the channel as internal test data and an internal test clock, respectively, in response to the corresponding external test clock.

In accordance with further embodiment of the present invention, a memory system includes a first memory device and one or more second memory devices arranged in a cascade structure, wherein the first memory device is suitable for: testing elements therein based on test data to output a test result thereof; and generating one or more internal clocks based on a corresponding external clock, and internal data based on the test data, and wherein each of the second memory devices is suitable for: testing elements therein based on internal data provided from a previous stage to output a test result thereof via the first memory device; and generating one or more internal clocks of a current stage based on internal clocks provided from the previous stage and a corresponding external clock, and internal data of the current stage based on the internal data of the previous stage.

DETAILED DESCRIPTION

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Throughout the specification, reference to "an embodiment," "another embodiment" or the like is not necessarily to the same embodiment, and different references to any such phrase are not necessarily to the same embodiment. The term "embodiments" as used herein does not necessarily refer to all embodiments.

Figure 1:
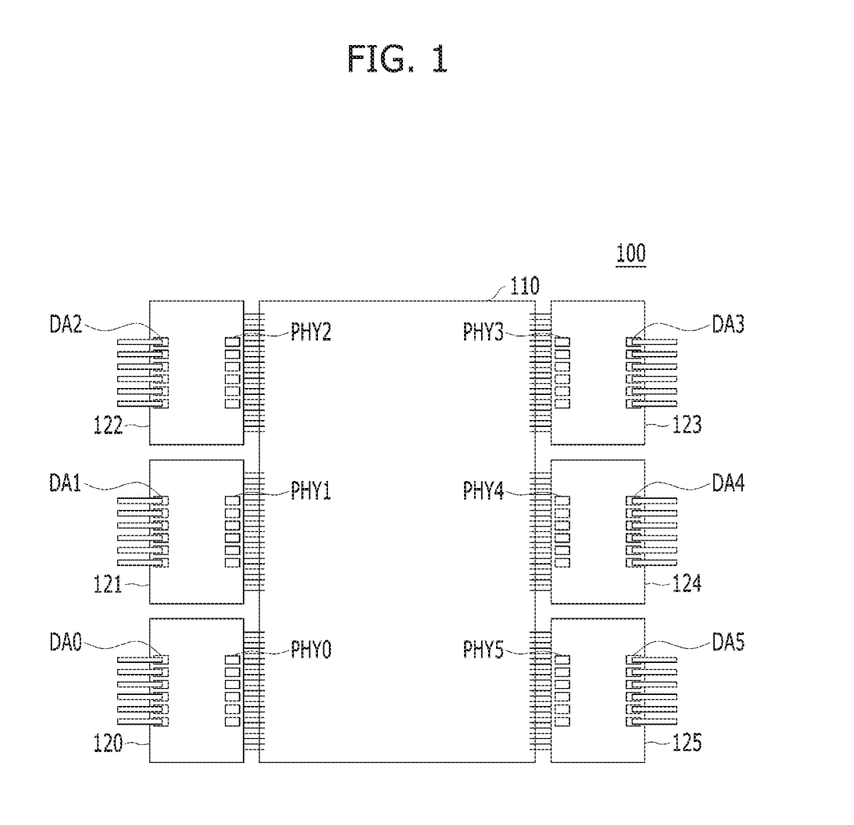
FIG. 1 is a plan view illustrating a memory system configured for a test operation.

FIG. 1 is a plan view illustrating a memory system 100 configured for a test operation.

Referring to FIG. 1, the memory system 100 may have a System In Package (SIP) structure. The memory system 100 may include a controller 110 and a plurality of memory devices 120 to 125.

The controller 110 may include a Central Processing Unit (CPU), a Graphic Processing Unit (GPU), a Digital Signal Processor (DSP), an Application Processor (AP), a memory controller chip and the like. Any of various types of processing units, i.e., processors, may be included in the controller 110 in the form of a System on Chip (SoC). In other words, the controller 110 may represent one chip in which different systems are integrated.

Each of the memory devices 120 to 125 may include a plurality of integrated circuit chips. The integrated circuit chips may be stacked on one another and electrically connected through a through silicon via (TSV). In other words, the memory devices 120 to 125 may be formed in a form of a high bandwidth memory (HBM) whose bandwidth is increased by increasing the number of input/output units.

However, the concept and spirit of the present invention are not limited thereto, and the memory devices 120 to 125 may include not only volatile memory devices, such as a Dynamic Random Access Memory (DRAM) device, but also non-volatile memory devices, such as a flash memory device, a Phase Change Random Access Memory (PCRAM) device, and a Resistive Random Access Memory (ReRAM) device, a Ferroelectric Random Access Memory (FeRAM) device, a Magnetic Random Access Memory (MRAM) device, a Spin Transfer Torque Random Access Memory (STTRAM) device, or the like. Alternatively, each of the memory devices 120 to 125 may be formed of a combination of two or more volatile memory devices and/or non-volatile memory devices.

The controller 110 and the memory devices 120 to 125 may be stacked over the interposer. The controller 110 and the memory devices 120 to 125 may communicate with each other through a signal path which is formed in the interposer. For communication with the controller 110, the memory devices 120 to 125 may include PHY interfaces PHY0 to PHY5 that are coupled to the interposer through micro bumps. However, it may be difficult to test the memory devices 120 to 125 through the PHY interfaces PHY0 to PHY5 because the physical size of the micro bumps is very small and the number of the micro bumps is equal to or more than approximately 1000.

Therefore, the memory devices 120 to 125 may include Direct Access (DA) interfaces DA0 to DA5 for directly accessing and testing the memory devices 120 to 125 from the outside, respectively. The DA interfaces DA0 to DA5 may be interfaced and used for testing through direct access pads having a relatively larger physical size and less number than the micro bumps.

Referring to FIG. 1, the DA interfaces DA0 to DA5 may be allocated to the memory devices 120 to 125, respectively. As the number of the memory devices 120 to 125 included in the memory system 100 increases, the number of the DA interfaces DA0 to DA5 may also increase. Due to the increased number of the DA interfaces DA0 to DA5, an additional channel may be allocated to an external interface, thereby increasing cost. In some memory systems, it may be difficult to realize a pin for DA interface due to a problem in package routing.

Figure 2:
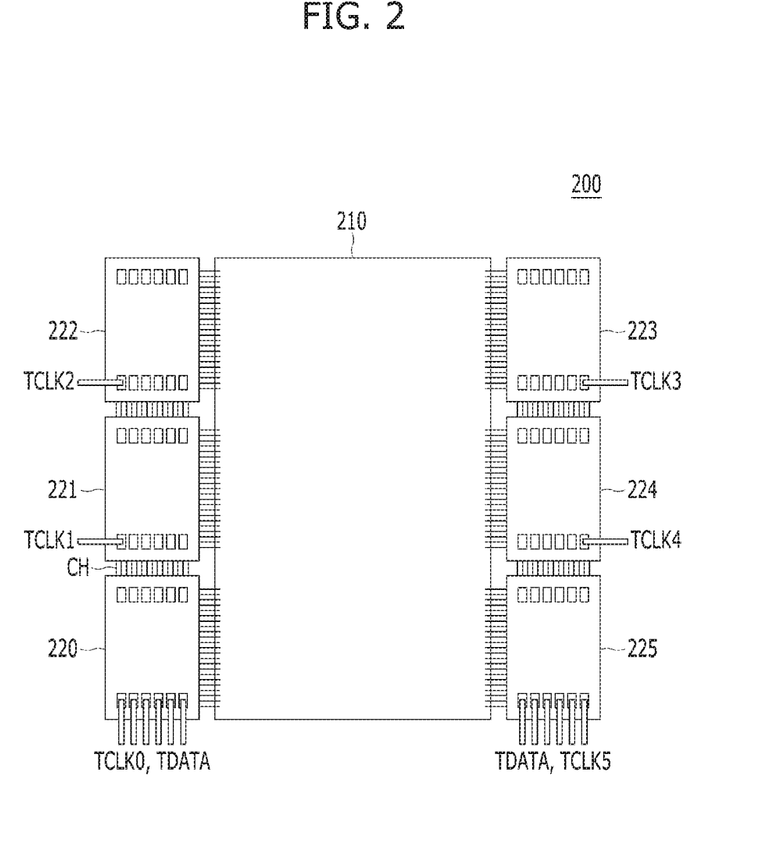
FIG. 2 is a plan view illustrating a memory system in accordance with an embodiment of the present invention.

FIG. 2 is a plan view illustrating a memory system 200 in accordance with an embodiment of the present invention. The memory system 200 may include a controller 210 and a plurality of memory devices 220 to 225.

Referring to FIG. 1, the memory devices 220 to 225 may be formed in a form of a High Bandwidth Memory (HBM). The structure of the memory devices 220 to 225 is described in detail below with reference to FIG. 3. With reference to FIG. 2, difference between the structure of the memory system 200 and the structure of the memory system 100 of FIG. 1 is mainly described.

The memory devices 220 to 225 may receive corresponding external test clocks TCK0 to TCK5 through the test clock input pads, respectively. In this case, the test clock input pads may include direct access pads. In other words, the memory devices 220 to 225 may receive the corresponding external test clocks TCK0 to TCK5 through the DA interfaces.

At least one memory device among the memory devices 220 to 225, that is, the first memory device 220 or the sixth memory device 225 may receive external test data TDATA through a test data input pad. The first memory device 220 or the sixth memory device 225 may generate a test control signal from the external test data TDATA and transfer it to each of the other memory devices 221 to 224 through a channel CH. The channel CH may include a signal path formed in the interposer. In other words, the memory devices 220 to 225 may transfer and receive a test control signal through PHY interfaces.

Figure 3:
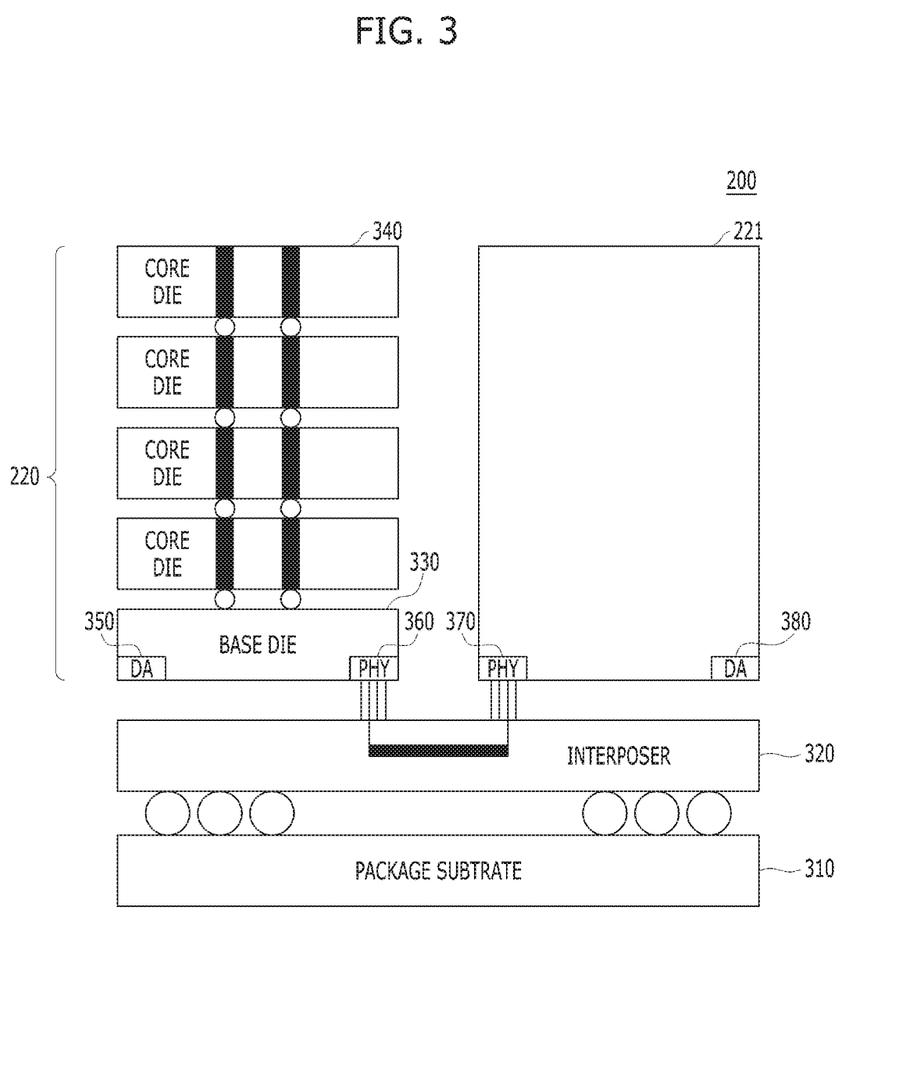
FIG. 3 is a cross-sectional view illustrating a plurality of memory devices, such as multiple instances of the memory device shown in FIG. 2.

FIG. 3 is a cross-sectional view illustrating the memory devices 220 and 221 shown in FIG. 2.

FIG. 3 illustrates a structure in which the first memory device 220 and the second memory device 221 are stacked. The memory system 200 may further include a package substrate 310 and an interposer 320 stacked over the package substrate 310. The first memory device 220 and the second memory device 221 may be stacked over the interposer 320 or may be electrically connected through a micro bump.

The first memory device 220 may include a plurality of integrated circuit chips 330 and 340 that are stacked on one another. The integrated circuit chips 330 and 340 may be electrically connected through a through silicon via (TSV) and a micro bump formed vertically penetrating the inside to transfer and receive signals.

The integrated circuit chips 330 and 340 may include a base die 330 and a plurality of core dies 340, respectively. A core die 340 may include a data storage space, such as a memory cell array and a memory register for storing data. On the other hand, circuits for transferring signals between the core dies 340 and the controller 210 may be disposed in the base die 330. Although FIG. 3 shows only the structure of the first memory device 220, the second memory device 221 may also be formed in a similar structure.

As described above, the first memory device 220 may communicate with the second memory device 221 through PHY interfaces 360 and 370 that are coupled to micro bumps. Also, the first memory device 220 and the second memory device 221 may receive corresponding external test clocks through the DA interfaces 350 and 380 that are formed of direct access pads.

Figure 4:
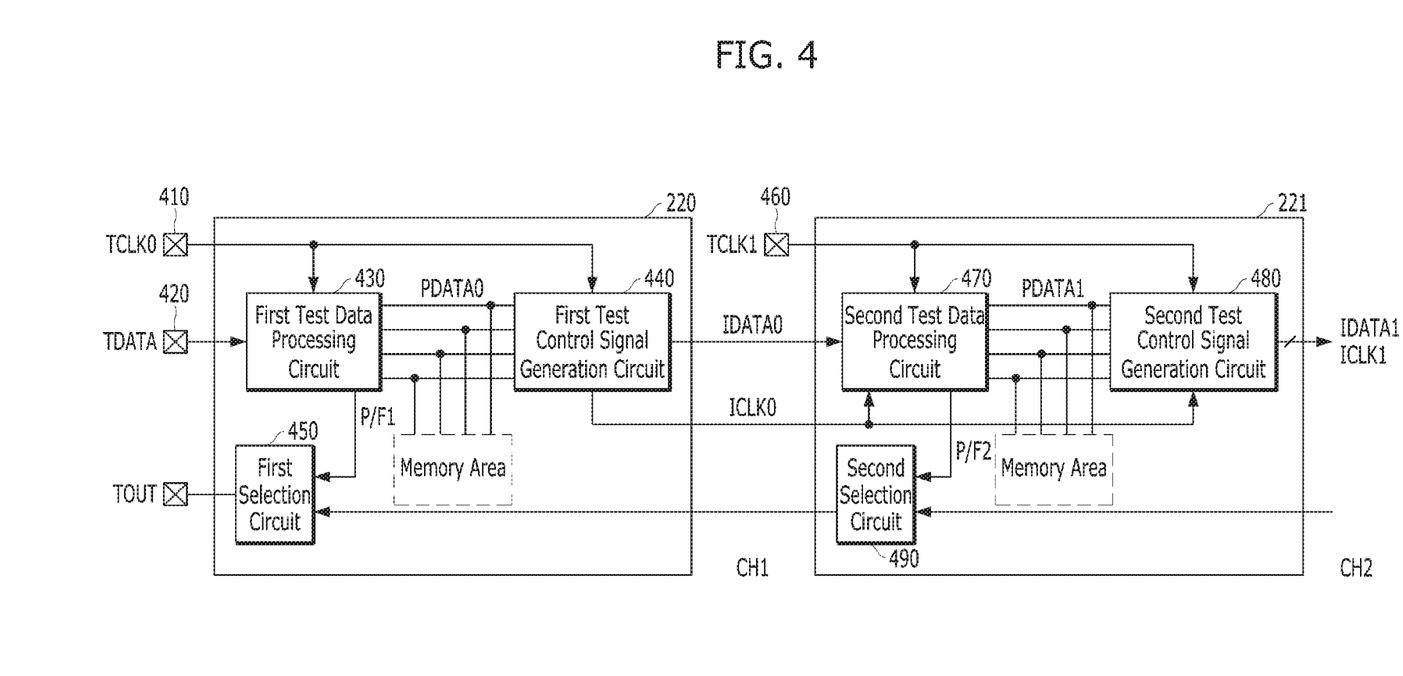
FIG. 4 is a block diagram illustrating a first memory device and a second memory device of FIG. 3.

FIG. 4 is a block diagram illustrating the first memory device 220 and the second memory device 221 shown in FIG. 3. FIG. 4 illustrates base dies of the first memory device 220 and the second memory device 221.

According to an embodiment of the present invention, each of the memory devices 220 to 225 may include a test clock input pad for receiving an external test clock. The first memory device 220 and the second memory device 221 may include a first test clock input pad 410 and a second test clock input pad 460, respectively, and receive a first external test clock TCLK0 and a second external test clock TCLK1. The first test clock input pad 410 and the second test clock input pad 460 may include direct access pads.

The first memory device 220 may further include a test data input pad 420, a first test data processing circuit 430, a first test control signal generation circuit 440, and a first selection circuit 450.

The first memory device 220 may receive external test data TDATA through the test data input pad 420. The test data input pad 420 may include a direct access pad.

The first test data processing circuit 430 may parallelize the external test data TDATA and transfer the parallelized data to a memory area in response to the first external test clock TCLK0. Herein, the memory area may represent the core dies 340 of the first memory device 220.

The first test control signal generation circuit 430 may generate first internal test data IDATA0 by serializing the parallelized test data PDATA0 in response to the first external test clock TCLK0. Also, the first test control signal generation circuit 430 may generate a first internal test clock ICLK0 by delaying the first external test clock TCLK0. The first memory device 220 may transfer the first internal test data IDATA0 and the first internal test clock ICLK0 to the second memory device 221 through a channel CH1.

Also, the first test data processing circuit 430 may combine the data transferred from the memory area to output a first test result signal P/F1. The first selection circuit 450 may output, as a test result TOUT, a signal selected among the first test result signal P/F1 and a test result signal transferred through the channel CH1.

The first selection circuit 450 may include a multiplexer. When the first test result signal P/F1 is inputted from the first test data processing circuit 430, the first selection circuit 450 may be switched to output the first test result signal P/F1 as the test result TOUT. When the first test result signal P/F1 is not inputted from the test data processing circuit 430, the first selection circuit 450 may output the test result signal transferred through the channel CH1 as the test result TOUT.

The second memory device may further include a second test data processing circuit 470, a second test control signal generation circuit 480, and a second selection circuit 490.

The second test data processing circuit 470 may parallelize and transfer the first internal test data IDATA0 to the memory area in response to the first internal test clock ICLK0 and the second external test clock TCLK1. Herein, the memory area may represent the core dies of the second memory device 221.

The second test control signal generation circuit 480 may generate second internal test data IDATA1 by serializing the parallelized test data PDATA1 in response to the first internal test clock ICLK0 and the second external test clock TCLK1. Also, the second test control signal generation circuit 480 may generate the second internal test clock ICLK1 by delaying the second external test clock TCLK1

The second memory device 221 may transfer the second internal test data IDATA1 and the second internal test clock TCLK1 to the third memory device 222 through a channel CH2.

The second test data processing circuit 470 may combine data transferred from the memory area to output the second test result signal P/F2. The second selection circuit 490 may transfer a signal selected among the second test result signal P/F2 and a test result signal transferred through the channel CH2 to the first memory device 220 through the channel CH1.

The first memory device 220 may generate the first internal test data IDATA0 based on the external test data TDATA inputted through the test data input pad 420 and transfer the generated first internal test data IDATA0 to the second memory device 221 through the channel CH1. For a test operation, the external test data TDATA may be parallelized in the first memory device 220. The first memory device 220 may serialize the parallelized data and transfer the serialized data to the second memory device 221.

The first memory device 220 may generate the first internal test clock ICLK0 by delaying the first external test clock TCLK0 by the time taken to parallelize the external test data TDATA and then serialize the parallelized data. In other words, the first memory device 220 may generate the first internal test clock ICLK0 by reflecting latency occurring in the first internal test data IDATA0. The first memory device 220 may transfer the first internal test clock ICLK0 to the second memory device 221 together with the first internal test data IDATA0.

The second memory device 221 may receive the first internal test data IDATA0 based on the first internal test clock ICLK0. The second memory device 221 may also adjust timing and transfer the second internal test data IDATA1 and the second internal test clock ICLK1 to the third memory device 222. In this way, the external test data TDATA inputted through the test data input pad 420 may be transferred to the memory devices 220 to 225 through the channel CH. The memory devices 220 to 225 may be coupled in a chain structure or in a cascade structure to reduce the number of the test data input pads 420.

The memory devices 220 to 225 may receive respective external test clocks TCLK0 to TCLK5 through the respective test clock input pads. Accordingly, it is possible to prevent the signal quality of the external test clocks TCLK0 to TCLK5 used in the memory devices 220 to 225 from being deteriorated. The memory devices 220 to 225 may stably receive the internal test data transferred through the channel based on the internal test clock, and rapidly process the received data based on the respective external test clocks TCLK0 to TCLK5. The memory devices 220 to 225 may include a structure for domain crossing between an internal test clock and corresponding external test clocks TCLK0 to TCLK5.

Figure 5:
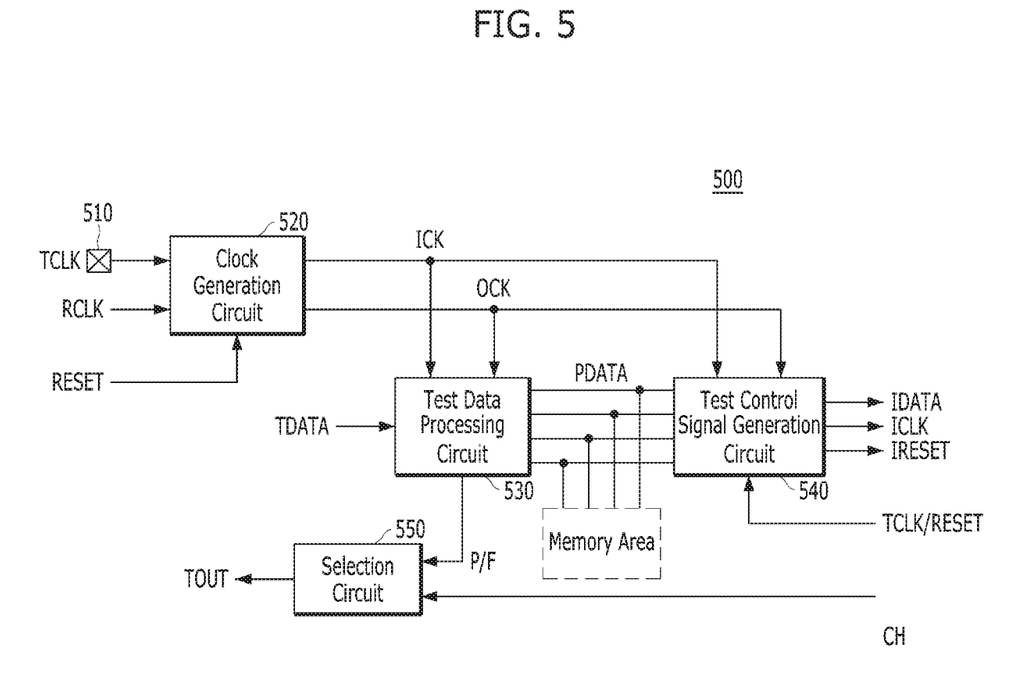
FIG. 5 is a block diagram illustrating a memory device in accordance with an embodiment of the present invention.

FIG. 5 is a block diagram illustrating a memory device 500 in accordance with an embodiment of the present invention.

The memory device 500 may include a test clock input pad 510, a clock generation circuit 520, a test data processing circuit 530, a test control signal generation circuit 540, and a selection circuit 550.

The memory device 500 may receive an external test clock TCLK through the test clock input pad 510. The test clock input pad 510 may include a direct access pad.

The clock generation circuit 520 may generate an input clock ICK and an output clock OCK based on a reference clock RCLK and an external test clock TCLK in response to a reset signal RESET. When the reset signal RESET is activated, the clock generation circuit 520 may transfer the reference clock RCLK and the external test clock TCLK as the input clock ICK and the output clock OCK. The clock generation circuit 520 may include logic gates that combine the reference clock RCLK and the external test clock TCLK, respectively, with the reset signal RESET.

The test data processing circuit 530 may parallelize test data TDATA and transfer the parallelized test data to the memory area in response to the input clock ICK and the output clock OCK. The test data processing circuit 530 may parallelize and store the test data TDATA in response to the input clock ICK and output the parallelized test data PDATA in response to the output clock OCK. The test data processing circuit 530 may be described more specifically with reference to FIG. 6.

The test control signal generation circuit 540 may serialize the parallelized test data PDATA in response to the input clock ICK and the output clock OCK to generate the internal test data IDATA and transfer the generated internal test data IDATA to the other memory devices through the channel CH. The test control signal generation circuit 430 may transfer the test clock TCLK and a delayed reset signal, which is obtained by delaying the reset signal RESET, as the internal test clock ICLK and the internal reset signal IRESET, respectively, through the channel CH.

The test data processing circuit 530 may combine the data transferred from the memory area to output a test result signal P/F. The selection circuit 550 may output the selected signal, among the test result signal P/F and the signals transferred through the channel CH, as the test result TOUT.

The memory device 500 may correspond to any one of the memory devices 220 to 225 shown in FIG. 2. When the memory device 500 is the first memory device 220, the memory device 500 may include a test data input pad and may receive external test data as the test data TDATA. Also, the memory device 500 may receive the external test clock TCLK inputted through the test clock input pad 510 as the reference clock RCLK.

When the memory device 500 is the second memory device 221, the memory device 500 may receive the internal test data IDATA transferred through the channel CH as the test data TDATA. Also, the memory device 500 may receive the internal test clock ICLK and the internal reset signal IRESET transferred through the channel CH as the reference clock RCLK and the reset signal RESET.

Figure 6:
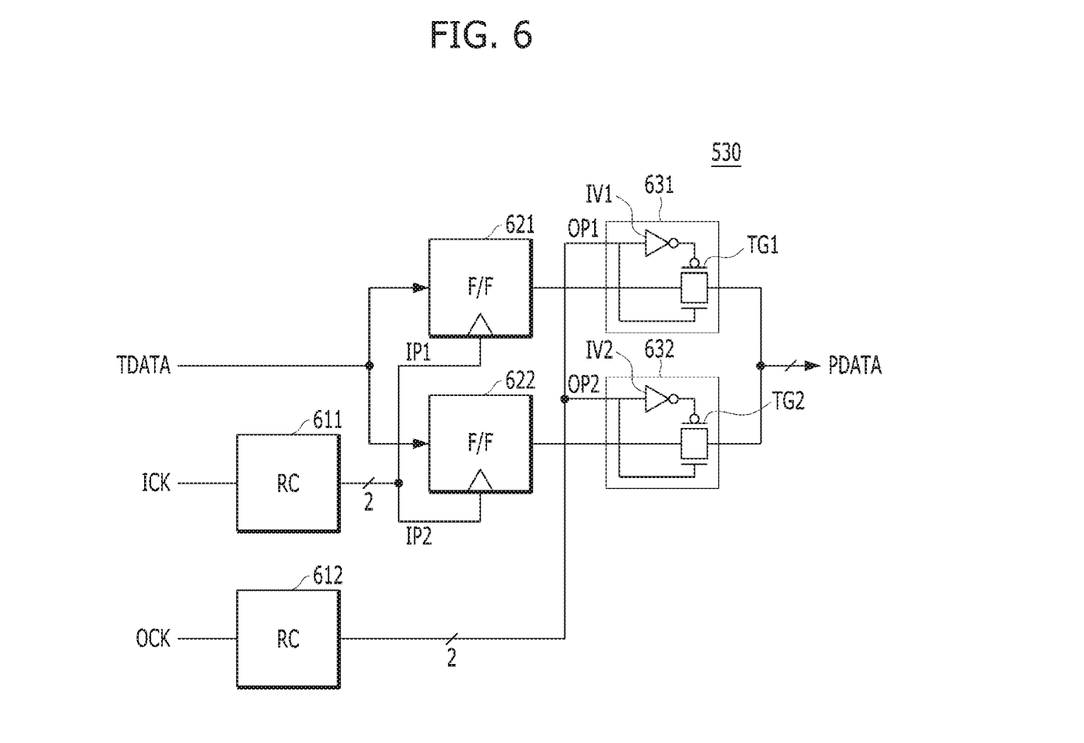
FIG. 6 is a schematic diagram illustrating a test data processing circuit, such as that shown in FIG. 5.

FIG. 6 is a schematic diagram illustrating the test data processing circuit 530 shown in FIG. 5.

FIG. 6 illustrates an example of a test data processing circuit 530 that receives serially inputted test data TDATA and outputs two parallel data PDATA. However, the concept and spirit of the present invention are not limited to this specific arrangement; rather, the number of parallel data PDATA that may be outputted may be determined according to the configuration and arrangement. Referring to FIG. 6, the test data processing circuit 530 may include counters RC, storages F/F, and first and second output components 631 and 632.

The counters RC may include a first ring counter 611 and a second ring counter 612. The first ring counter 611 may count the input clock ICK to sequentially activate input pulse signals IP1 and IP2 that are synchronized with the input clock ICK. The second ring counter 612 may count the output clock OCLK to sequentially activate the output pulse signals OP1 and OP2 that are synchronized with the output clock OCLK.

The storages F/F may include a first flip-flop 621 and a second flip-flop 622. As the input pulse signals IP1 and IP2 are sequentially activated, the first and second data of the test data TDATA serially inputted to the first flip-flop 621 and the second flip-flop 622 may be sequentially received and stored.

The first output component 631 may include a first inverter IV1 and a first transfer gate TG1. The first output component 631 may output the data stored in the first flip-flop 621 as parallel data PDATA in response to the first output pulse signal OP1. Similarly, the second output component 632 may include a second inverter IV2 and a second transfer gate TG2. The second output component 632 may output the data stored in the second flip-flop 622 as parallel data PDATA in response to the second output pulse signal OP2.

Although FIG. 6 shows the structure of the test data processing circuit 530 that converts serial data TDATA into parallel data PDATA, the test control signal generation circuit 540 that converts parallel data PDATA into serial data IDATA may also be formed similarly. In other words, the test data processing circuit 530 or the test control signal generation circuit 540 may store data in response to the input clock ICK, and converts the stored data into serial data or in parallel data to output the data in response to the output clock OCK. Therefore, the test data processing circuit 530 and the test control signal generation circuit 540 may stably synchronize and process data between different clock domains. For example, the test data processing circuit 530 and the test control signal generation circuit 540 may include a first-in first-out (FIFO) pipe latch.

Figure 7:
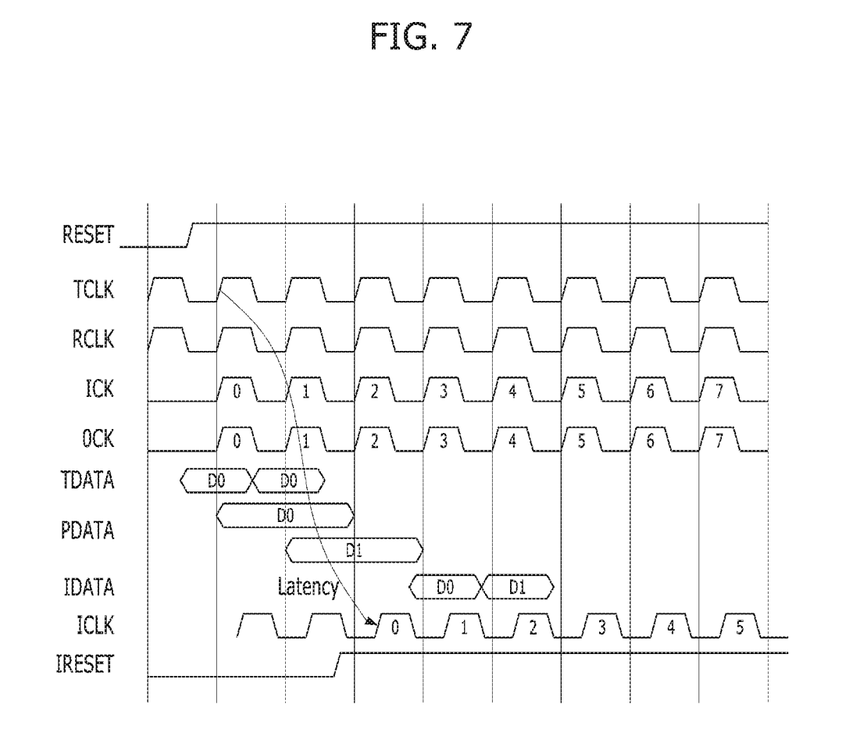
FIG. 7 is a waveform diagram illustrating an operation of a memory device in accordance with an embodiment of the present invention.

FIG. 7 is a waveform diagram illustrating an operation of a memory device 500 in accordance with an embodiment of the present invention.

The memory device 500 may receive an external test clock TCLK through the test clock input pad 510. The memory device 500 may receive the external test clock TCLK as a reference clock RCLK or receive an internal test clock ICLK transferred through the channel CH as a reference clock RCLK.

The clock generation circuit 520 may generate an input clock ICK and an output clock OCK based on the reference clock RCLK and the external test clock TCLK in response to the reset signal RESET. When the reset signal RESET is activated, the clock generation circuit 520 may transfer the reference clock RCLK and the external test clock TCLK as the input clock ICK and the output clock OCK.

The test data processing circuit 530 may store serially inputted test data TDATA in a plurality of storages coupled in parallel in response to the input clock ICK. The test data processing circuit 520 may output data stored in the storages as parallel test data PTDATA in response to the output clock OCLK.

The test control signal generation circuit 540 may serialize and store the parallel test data PDATA in response to the input clock ICK and output the stored data as internal test data IDATA in response to the output clock OCK. In this case, the test control signal generation circuit 540 may generate and output an internal reset signal IRESET by delaying the reset signal RESET while outputting the external test clock TCLK as the internal test clock ICLK.

Herein, the reset signal RESET may be delayed up to the time it takes to parallelize the test data TDATA and then serialize the obtained parallel data back into the serial data. Based on the internal reset signal IRESET generated as above, the memory device receiving the internal test clock ICLK and the internal test data IDATA may perform a clock gating operation and may be synchronized to the input timing of the internal test data IDATA. Therefore, the internal test data IDATA, the internal test clock ICLK, and the internal reset signals IRESET may be synchronized and transferred between the memory devices 220 to 225.

A memory device may be packaged to be integrated within a memory system to be used as a cryogenic system. Therefore, it may be difficult to separate the memory device from the system and perform failure analysis. When the failure analysis is not performed smoothly in the cryogenic system, it may be difficult to realize it in a single product test environment. The present invention may decrease the number of channels allocated to an external interface by minimizing the number of test pins of a plurality of memory devices packaged in a memory system. Therefore, failure analysis of the memory system may be stably performed without increasing cost.

According to embodiments of the present invention, test data inputted through a limited number of test pads may be transferred to a plurality of memory devices through channels in a memory system including the memory devices. Therefore, the number of channels allocated to an external interface of the memory system may be reduced, and a test operation of the memory system may be performed without increasing cost.

When test data are transferred between the plurality of memory devices, test control signals may be generated and transferred together. The timing of the test operation of the memory devices may be adjusted, and the efficiency of the test operation may be increased to reduce the fabrication costs of the memory devices.

While the present invention has been illustrated and described with respect to specific embodiments, it will be apparent to those skilled in the art in light of the present disclosure that various changes and modifications may be made without departing from the spirit and scope of the invention. The present invention encompasses all changes and modifications that fall within the scope of the following claims.

What is claimed is:

1. A memory system, comprising:
    a plurality of memory devices coupled to each other through a channel;
    wherein each of the memory devices includes:
        a test clock input pad suitable for receiving an external test clock;
        a clock generation circuit suitable for generating an input clock and an output clock based on a reference clock and the external test clock in response to a reset signal;
        a test data processing circuit suitable for parallelizing test data so as to produce parallelized test data and transfer the parallelized test data to a memory area in response to the input clock and the output clock; and
        a test control signal generation circuit suitable for generating internal test data by serializing the parallelized test data and transferring the internal test data to the channel in response to the input clock and the output clock.

2. The memory system of claim 1, wherein a first memory device among the memory devices includes a test data input pad, and receives external test data as test data through the test data input pad.

3. The memory system of claim 2, wherein a second memory device among the memory devices receives the internal test data transferred from the first memory device through the channel as the test data.

4. The memory system of claim 1, wherein the test control signal generation circuit transfers the external test clock and a delayed reset signal, which is obtained by delaying the reset signal, to the channel as an internal test clock and an internal reset signal, respectively.

5. The memory system of claim 4, wherein a first memory device among the memory devices receives the external test clock as the reference clock.

6. The memory system of claim 5, wherein a second memory device among the memory devices receives the internal test clock and the internal reset signal, which are transferred from the first memory device through the channel, as the reference clock and the reset signal, respectively.

7. The memory system of claim 1, wherein the test data processing circuit includes:
    a first ring counter suitable for counting the input clock to sequentially activate input pulse signals that are synchronized with the input clock;
    a second ring counter suitable for counting the output clock to sequentially activate output pulse signals that are synchronized with the output clock;
    a plurality of storages suitable for sequentially storing test data in response to the input pulse signals; and
    a plurality of output components suitable for sequentially outputting the test data stored in the storages in response to the output pulse signals.

8. The memory system of claim 1, wherein the test data processing circuit combines data transferred from the memory area to output a test result signal.

9. The memory system of claim 1, wherein each of the memory devices further includes:
    a selection circuit suitable for outputting a signal which is selected among test result signals transferred through the test data processing circuit and the channel.

10. The memory system of claim 1,
    wherein each of the memory devices further includes:
    a base die stacked over an interposer; and
    a plurality of core dies stacked over the base die and electrically connected thereto through a through silicon via and a micro bump,
    wherein the memory devices transfer and receive the internal test data through the channel which is formed in the interposer.

11. The memory system of claim 1, wherein the test clock input pad includes a direct access pad.

12. A memory system, comprising:
    a first memory device and a second memory device suitable for transferring and receiving test control signals to and from each other through a channel, and suitable for receiving respective external test clocks through respective test clock input pads,
    wherein the first memory device includes:
        a test data input pad suitable for receiving external test data;
        a first test data processing circuit suitable for parallelizing the external test data so as to produce parallelized external test data and transferring the parallelized external test data to a memory area in response to the corresponding external test clock; and
        a first test control signal generation circuit suitable for serializing the parallelized external test data so as to produce serialized data and transferring the serialized data and a delayed clock of the corresponding external test clock to the channel as internal test data and an internal test clock, respectively, in response to the corresponding external test clock.

13. The memory system of claim 12, wherein the second memory device includes:
- a second test data processing circuit suitable for parallelizing the internal test data so as to produce parallelized internal test data and transferring the parallelized internal test data to a memory area in response to the internal test clock and the corresponding external test clock; and
- a second test control signal generation circuit suitable for serializing the parallelized internal test data so as to produce serialized data and transferring the serialized data and the delayed clock of the corresponding external test clock to the channel in response to the internal test clock and the corresponding external test clock.

14. The memory system of claim 12, wherein the first memory device further includes:
- a clock generation circuit suitable for generating an input clock and an output clock based on the corresponding external test clock in response to a reset signal.

15. The memory system of claim 14, wherein the first test data processing circuit includes:
- a first ring counter suitable for counting the input clock to sequentially activate input pulse signals that are synchronized with the input clock;
- a second ring counter suitable for counting the output clock to sequentially activate output pulse signals that are synchronized with the output clock;
- a plurality of storages suitable for sequentially storing the external test data in response to the input pulse signals; and
- a plurality of output components suitable for sequentially outputting the external test data stored in the storages in response to the output pulse signals.

16. The memory system of claim 14, wherein the first test control signal generation circuit transfers a delayed reset signal, which is obtained by delaying the reset signal, to the channel as an internal reset signal.

17. The memory system of claim 12, wherein the first test data processing circuit combines data transferred from the memory area and outputs a test result signal.

18. The memory system of claim 12, wherein the first memory device further includes:
- a first selection circuit suitable for outputting a signal selected among test result signals transferred through the first test data processing circuit and the channel.

19. The memory system of claim 12,
wherein each of the first and second memory devices includes:
- a base die stacked over an interposer; and
- a plurality of core dies stacked over the base die and electrically connected thereto through a through silicon via and a micro bump,
wherein the first and second memory devices transfer and receive the test control signal through the channel which is formed in the interposer.

20. The memory system of claim 12, wherein the test clock input pad and the test data input pad include a direct access pad.

21. A memory system comprising a first memory device and one or more second memory devices arranged in a cascade structure,
wherein the first memory device is suitable for:
testing elements therein based on test data to output a test result thereof; and
generating one or more internal clocks based on a corresponding external clock, and internal data based on the test data, and
wherein each of the second memory devices is suitable for:
testing elements therein based on internal data provided from a previous stage to output a test result thereof via the first memory device; and
generating one or more internal clocks of a current stage based on internal clocks provided from the previous stage and a corresponding external clock, and internal data of the current stage based on the internal data of the previous stage.

* * * * *